United States Patent
Yano et al.

(10) Patent No.: US 8,917,010 B2
(45) Date of Patent: Dec. 23, 2014

(54) LIGHTING DEVICE INCLUDING PHOSPHOR LAYER AND LIGHT-TRANSMITTING LAYER THAT IS ARRANGED IN CONTACT WITH THE PHOSPHOR LAYER TO RELEASE STATIC CHARGE TO SUBSTRATE

(71) Applicants: Citizen Electronics Co., Ltd., Fujiyoshida-shi, Yamanashi-ken (JP); Citizen Holdings Co., Ltd., Nishi-Tokyo-shi, Tokyo (JP)

(72) Inventors: Takakazu Yano, Tokyo (JP); Masato Yazaki, Yamanashi-ken (JP); Masatoshi Sasuga, Yamanashi-ken (JP); Mitsunori Miyamoto, Nagano-ken (JP)

(73) Assignees: Citizen Electronics Co., Ltd., Yamanashi-Ken (JP); Citizen Holdings Co., Ltd., Tokyo (JP)

( * ) Notice: Subject to any disclaimer, the term of this patent is extended or adjusted under 35 U.S.C. 154(b) by 0 days.

(21) Appl. No.: 13/756,916

(22) Filed: Feb. 1, 2013

(65) Prior Publication Data
US 2013/0200785 A1     Aug. 8, 2013

(30) Foreign Application Priority Data
Feb. 2, 2012   (JP) ................................. 2012-020592

(51) Int. Cl.
| | | |
|---|---|---|
| H01L 33/50 | (2010.01) | |
| H01L 33/64 | (2010.01) | |
| H05B 33/02 | (2006.01) | |
| H05B 33/28 | (2006.01) | |

(52) U.S. Cl.
CPC .............. *H05B 33/02* (2013.01); *H05B 33/28* (2013.01); *H01L 33/642* (2013.01); *H01L 33/641* (2013.01); *H01L 33/507* (2013.01); *H01L 33/644* (2013.01)

USPC .............................. 313/46; 313/501; 313/512

(58) Field of Classification Search
CPC ... H01L 33/507; H01L 33/641; H01L 33/145; H01I 33/642; H01I 33/644
USPC .............................................. 313/46, 501, 512
See application file for complete search history.

(56) References Cited

U.S. PATENT DOCUMENTS

| | | | | |
|---|---|---|---|---|
| 2002/0070681 | A1* | 6/2002 | Shimizu et al. ............... | 315/246 |
| 2004/0135156 | A1* | 7/2004 | Takenaka ........................ | 257/79 |
| 2007/0246712 | A1* | 10/2007 | Kim et al. ...................... | 257/79 |

(Continued)

FOREIGN PATENT DOCUMENTS

JP     2009-277843 A     11/2009

*Primary Examiner* — Nimeshkumar Patel
*Assistant Examiner* — Steven Horikoshi
(74) *Attorney, Agent, or Firm* — Browdy and Neimark, PLLC (57) ABSTRACT

In a first aspect of the present invention, a lighting device includes a light-emitting element, a phosphor layer including a phosphor and spaced from the light-emitting element, and a light-transmitting layer with thermal conductivity that is higher than thermal conductivity of the phosphor layer, the light-transmitting layer disposed in contact with the phosphor layer. It is disclosed that the phosphor layer has first and second surfaces opposite to each other. In some embodiments, the light-transmitting layer that transmits light emitted from the light-emitting element is disposed on the first surface of the phosphor layer. It is also disclosed that the first light-transmitting layer that transmits light emitted from the light-emitting element is disposed on the first surface of the phosphor layer and a second light-transmitting layer that transmits visible light is disposed on the second surface of the phosphor layer.

22 Claims, 9 Drawing Sheets

(56) References Cited

U.S. PATENT DOCUMENTS

2009/0322197 A1* 12/2009 Helbing .......................... 313/46
2009/0322205 A1* 12/2009 Lowery ......................... 313/493
2010/0133556 A1* 6/2010 Li et al. ........................... 257/88
2011/0194282 A1* 8/2011 Paik et al. ..................... 362/245
2011/0227108 A1* 9/2011 Tetz et al. ....................... 257/98
2012/0286310 A1* 11/2012 Kim et al. ....................... 257/98

* cited by examiner

LIGHTING DEVICE INCLUDING PHOSPHOR LAYER AND LIGHT-TRANSMITTING LAYER THAT IS ARRANGED IN CONTACT WITH THE PHOSPHOR LAYER TO RELEASE STATIC CHARGE TO SUBSTRATE

CROSS-REFERENCE TO RELATED APPLICATION

This application is based on and claims the priority benefit of Japanese Patent Application No. 2012-20592, filed on Feb. 2, 2012, the disclosure of which is incorporated herein by reference in its entirety.

BACKGROUND OF THE INVENTION

1. Field of the Invention

The present invention relates to a lighting device, and also relates to a lighting device includes a light-emitting element with a phosphor layer spaced from the light-emitting element.

2. Description of the Related Art

It is laid open to the public that a light-emitting device includes a light-emitting element, a substrate on which the light-emitting element is mounted, a wavelength conversion member that converts wavelength of light emitted from the light-emitting element, and a thermally conductive member spaced apart from the substrate and abutting against a periphery of the wavelength conversion member to dissipate at least part of the heat in the wavelength conversion member (For reference, see Japanese Unexamined Patent Application Publication No. 2009-277843).

SUMMARY OF THE INVENTION

In a first aspect of the present invention, a lighting device includes a light-emitting element, a phosphor layer including a phosphor and spaced from the light-emitting element, and a light-transmitting layer with thermal conductivity that is higher than thermal conductivity of the phosphor layer, and the light-transmitting layer is disposed in contact with the phosphor layer.

It is disclosed that the phosphor layer has first and second surfaces opposite to each other, and the first surface faces the light-emitting element. The light-transmitting layer may be entirely disposed on the first surface of the phosphor layer. Also, it is disclosed that the light-transmitting layer disposed on the first surface of the phosphor layer is a transparent electrode layer.

In a second aspect of the present invention, it is disclosed that the light-transmitting layer includes a first light-transmitting layer disposed on the first surface of the phosphor layer and a second light-transmitting layer disposed on the second surface of the phosphor layer.

It is disclosed that the first light-transmitting layer transmits light emitted from the light-emitting element and the second light-transmitting layer transmits visible light.

DETAILED DESCRIPTION OF THE EMBODIMENTS

As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising," "includes", "including", "has" and/or "having" when used herein, specify the presence of stated features, integers, steps, operations, elements, components, and/or portions of an element, but do not preclude the presence or addition of one or more other features, integers, steps, operations, elements, components, portions, and/or groups thereof.

Furthermore, as used herein, the term "light-emitting element" may be used as a light-emitting diode (LED) element including a first electrode and a second electrode as a bare chip in some embodiments. The bare chip may be a wafer-level chip. The term "light-emitting element" may be used as an LED element electrically connected to a lead-frame. In other embodiments, the term "light-emitting element" may be used as an LED element electrically connected to a substrate. In further embodiment, the term "light-emitting element" may be used as a light-emitting package in that a plurality of LED elements may be arranged, lined, arrayed in lines, and/or distributed as evenly as possible in an area of the light-emitting package.

Also, as used herein, the term "frame" is used to indicate an element, a component, a portion, and/or a combination thereof that positions a phosphor layer with a light-transmitting layer spaced from a light-emitting element. The light-emitting element faces the phosphor layer with the light-transmitting layer. A gas may be arranged in a space between the light-transmitting layer layered on the phosphor layer and the light-emitting element.

Relative terms such as "below" or "above" or "upper" or "lower" may be used herein to describe a relationship of one element, layer or region to another element, layer or region as illustrated in the figures. It will be understood that these terms are intended to encompass different orientations of a device in addition to the orientation depicted in the figures.

Embodiments of the invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

Embodiments of the invention are described with reference to drawings included herewith. Same and/or similar reference numbers refer to same and/or similar structures throughout. It should be noted that the drawings are schematic in nature.

Figure 1A:
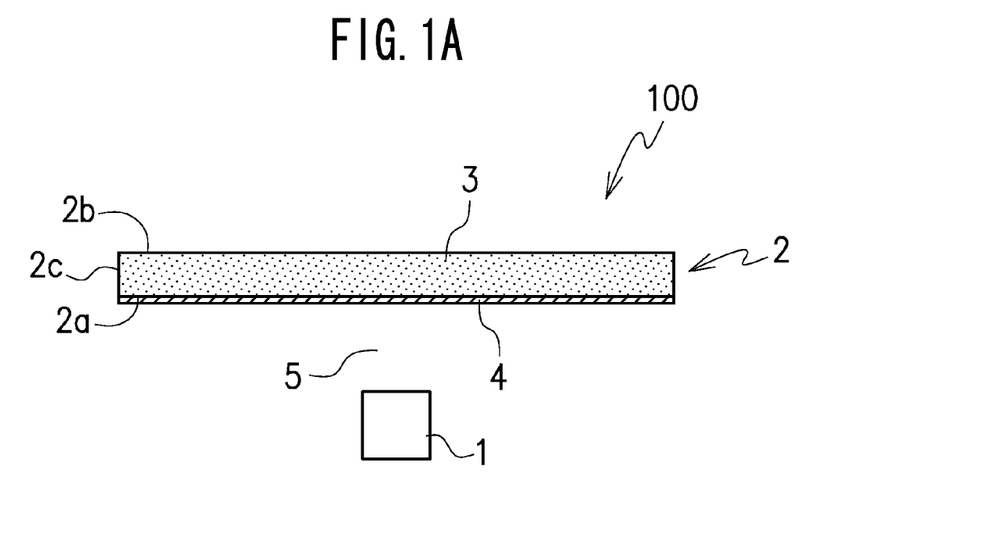
FIG. 1A is a schematic side view of a lighting device according to a first embodiment of the present invention.
Figure 1B:
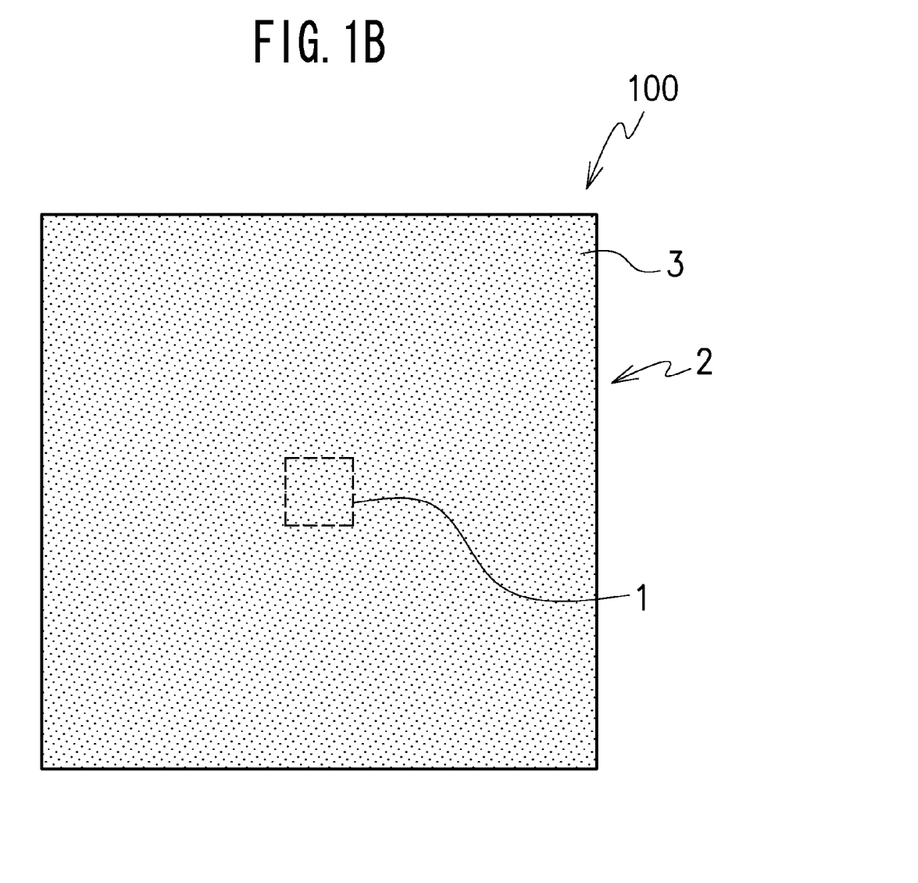
FIG. 1B is a schematic top plan view of the lighting device shown in FIG. 1A.

FIG. 1A shows a schematic side view of a lighting device 100 and FIG. 1B shows a schematic top plan view of the lighting device 100 according to the first embodiment of the present invention. The lighting device 100 of the first embodiment includes a light-emitting element 1, a phosphor layer 2 that includes a phosphor 3 and is spaced from the light-emitting element 1, and a light-transmitting layer 4 disposed in contact with the phosphor layer 2. The light-transmitting layer 4 has thermal conductivity that is higher than thermal conductivity of the phosphor layer 2. The light-transmitting layer 4 may be layered on the phosphor layer 2.

For more details, the phosphor layer 2 has first and second surfaces 2a, 2b opposite to each other. The phosphor layer 2 has a peripheral surface 2c extending between the first surface 2a and the second surface 2b. The first surface 2a of the phosphor layer 2 faces the light-emitting element 1. The light-transmitting layer 4 that transmits light emitted from the light-emitting element 1 is disposed on the first surface 2a of the phosphor layer 2. The phosphor layer 2 can be a sheet-shape, a plate-shape, and/or a shape of coating. The peripheral surface 2c of the phosphor layer 2 may be a peripheral edge of the phosphor layer 2. The phosphor layer 2 may be made of resin sheet, plate, and/or a coating that contain a phosphor.

The light-transmitting layer 4 has thermal conductivity higher than thermal conductivity of the phosphor layer 2, and it can be expected that the light-transmitting layer 4 prevents radiant heat of the light-emitting element 1 from entering the phosphor layer 2. Also, as the phosphor 3 included in the phosphor layer 2 generates heat when excited by the light from the light-emitting element 1, the light-transmitting layer 4 disposed on the first surface 2a of the phosphor layer 2 can be expected to absorb and/or reflect radiant heat radiated from the phosphor 3 and to release the heat outside of the lighting device 100. The light-transmitting layer 4 may be entirely disposed on the first surface 2a of the phosphor layer 2.

The light-transmitting layer 4 that transmits light emitted from the light-emitting element 1 may be a transparent electrode layer. The transparent electrode layer may be an indium tin oxide (ITO) layer.

In particular, an ITO layer can have a thermal conductivity that is around 0.8 W/m·K, which is higher than a resin included in a phosphor layer. The resin included in the phosphor layer is considered to have thermal conductivity that is around 0.2 W/m·K. Accordingly, the light-transmitting layer 4 with thermal conductivity that is higher than thermal conductivity of the phosphor layer 2 can reflect and/or absorb heat and also the light-transmitting layer that is a transparent electrode can be electrically conductive. The transparent electrode as the light-transmitting layer 4 may include a tin oxide layer, and/or a zinc oxide layer. It can be expected that free electrons in the light-transmitting layer 4 reflect infrared light. The light-transmitting layer 4 can be expected to reflect radiation heat radiated from the light-emitting element 1 and to reflect radiation heat radiated from the phosphor 3 included in the phosphor layer 2 when the phosphor 3 is excited by light from the light-emitting element 1.

As a variation, the light-transmitting layer 4 may include a dielectric layer. As the dielectric layer may have the effect of interference of light, it is expected to be an antireflection layer that minimizes the loss of light emitted from the light-emitting element 1 and/or minimizes the loss of visible light.

As shown in this embodiment, a gas 5 is arranged between the light-transmitting layer 4 and the light-emitting element 1. The gas may be air. Furthermore, as a variation, if the gas is an inactive gas, it may be useful to suppress deterioration of inner parts that are exposed to the gas in the lighting device 100, compared to when the gas filled in a space between the light-emitting element 1 and the light-transmitting layer 4 is air.

Figure 2:
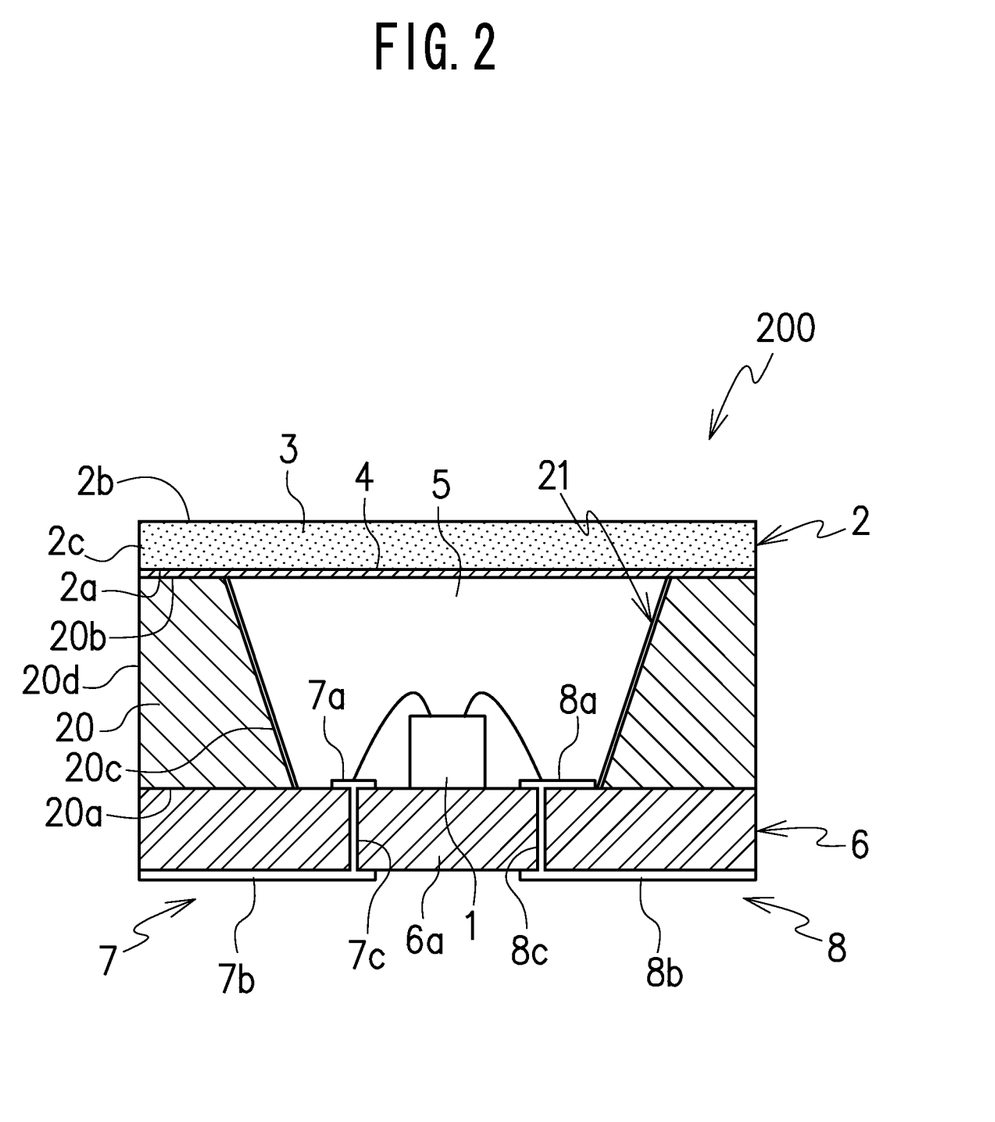
FIG. 2 is a cross-sectional view of a lighting device according to a second embodiment of the present invention.

FIG. 2 shows a cross-sectional view of a lighting device 200 according to a second embodiment of the present invention. The lighting device 200 of the second embodiment includes a light-emitting element 1, a phosphor layer 2 including a phosphor 3 and spaced from the light-emitting element 1, and a light-transmitting layer 4 disposed in contact with the phosphor layer 2. The light-transmitting layer 4 may be layered and/or coated on the phosphor layer 2.

The light-transmitting layer 4 has thermal conductivity that is higher than thermal conductivity of the phosphor layer 2. Similarly to the first embodiment, a gas 5 is arranged in a space between the light-transmitting layer 4 and the light-emitting element 1 in this embodiment. In this embodiment, the light-emitting element 1 further includes a substrate 6. The substrate 6 may include an electrically insulating layer 6a, first and second electrodes 7, 8 that are spaced from each other and arranged on the electrically insulating layer 6a. The electrically insulating layer 6a may be an electrically insulating board. The first electrode 7 includes a first upper electrode 7a disposed on an upper surface of the electrically insulating layer 6a, a first lower electrode 7b disposed on a lower surface of the electrically insulating layer 6a, and a through-hole 7c that is configured to pass through the electrically insulating layer 6a and electrically connect the first upper electrode 7a and the first lower electrode 7b. The second electrode 8 includes a second upper electrode 8a disposed on the upper surface of the electrically insulating layer 6a, a second lower electrode 8b disposed on the lower surface of the electrically insulating layer 6a, and a through-hole 8c that is configured to pass through the electrically insulating layer 6a and electrically connect the second upper electrode 8a and the second lower electrode 8b. In this embodiment, the electrically insulating layer 6a may be made of resin. The light-emitting element 1 mounted on the electrically insulating layer 6a can be electrically connected to the first electrode 7 and the second electrode 8 by metal wires and/or bumps.

As previously explained, the first light-transmitting layer 4 may be a transparent electrode, which can be used to release a static electrical charge accumulated in the lighting device 200 to the substrate 6. As shown in FIG. 2, the lighting device 200 further includes a frame 20 that includes a grounding path 21. The frame 20 includes an upper surface 20b that supports the light-transmitting layer 4 that is in contact with the first surface 2a of the phosphor layer 2, and includes a lower surface that is disposed on the upper surface of the substrate 6 in this embodiment. The frame 20 is electrically insulated from the first electrode 7 of the substrate 6 and the grounding path 21 of the frame 20 electrically connects the light-transmitting layer 4 and the second electrode 8. In this embodiment, the frame 20 may be made of an electrically insulating material, and the frame 20 may include an electrically connecting portion as the grounding path 21 that extends from a position adjacent to the light-transmitting layer 4 to a position adjacent to the substrate 6.

The grounding path 21 may be disposed on an inner surface 20c or an outer surface 20d of the frame 20. Also, as a variation, when the frame is made of an electrically conductive material, the frame itself can be a grounding path. In this case, the frame 20 may be electrically insulated from the first electrode 7 of the substrate 6 and electrically connected to the second electrode 8 that is a cathode electrode. Generally, it is preferable to release a static electrical charge to an electrode that has more capacity than another electrode. Accordingly, though a static electrical discharge at an electronic part, an electrical device, and/or a lighting device sometimes causes damage on the electronic part, the electrical device, and/or the lighting device, it is possible that the lighting device 200 has a grounding path to release a static electrical charge to the substrate 6 with this configuration.

Also, the frame 20 may be used as a reflector to reflect light from the light-emitting element 1 toward the light-transmitting layer 4 that is in contact with the phosphor layer 2.

Figure 3A:
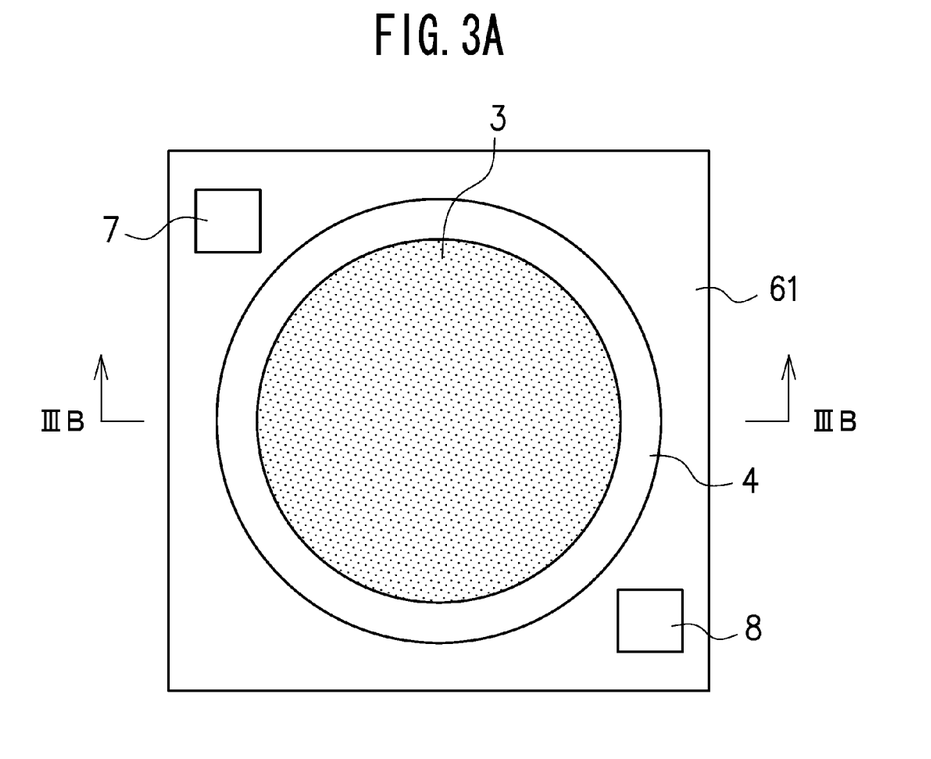
FIG. 3A is a top plan view of a lighting device according to the third embodiment of the present invention.
Figure 3B:
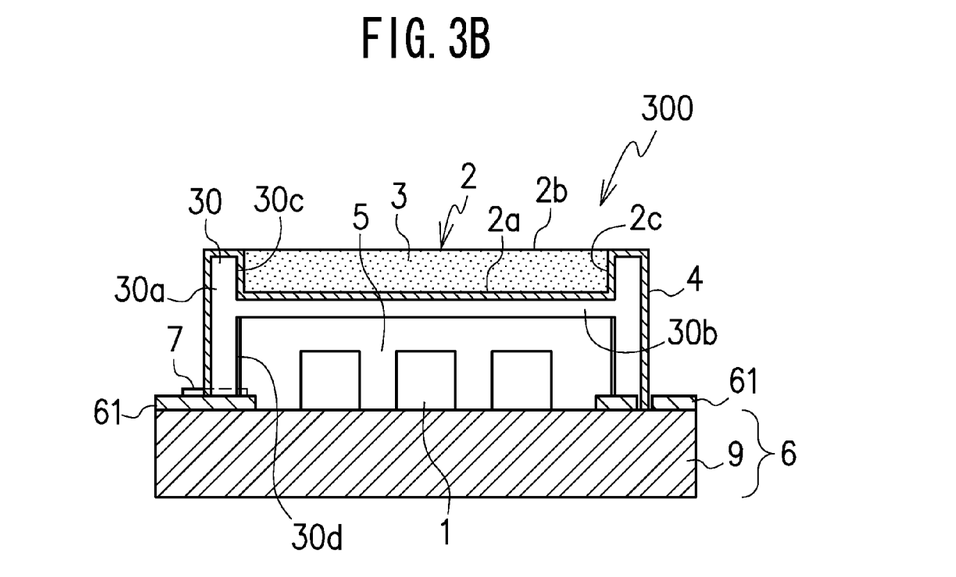
FIG. 3B is a cross-sectional view of the lighting device according to a third embodiment of the present invention.

FIG. 3A shows a top plan view of a lighting device 300 according to a third embodiment of the present invention, and FIG. 3B shows a cross-sectional view of the lighting device 300.

In this embodiment, the lighting device 300 includes a frame 30 that transmits light from the light-emitting element 1. The frame 30 in this embodiment may be made of a transparent resin. The transparent resin can be made of a silicone resin, epoxy resin, and/or an acrylic resin. The frame 30 includes a surrounding portion 30a that is positioned around the light-emitting element 1 and a top plate 30b that is positioned to cover the light-emitting element 1 from above the light-emitting element 1. The frame 30 includes a first hollow 30c outlined by the surrounding portion 30a and the top plate 30b. The light-transmitting layer 4 is layered and/or coated on the first hollow 30c, and the phosphor layer 3 is positioned on the light-transmitting layer 4 in the first hollow 30c. The frame 30 further includes a second hollow 30d outlined by the surrounding portion 30a and the top plate 30b and positioned below the first hollow 30c. The frame 30 is disposed on an upper surface of the substrate 6 and the second hollow 30d of the frame 30 houses the light-emitting element 1 disposed on the substrate 6.

In this embodiment, the light-transmitting layer 4 is layered on the first surface 2a of the phosphor layer 2 and extends through the peripheral side surface 2c of the phosphor layer 2 and an outer surface of the surrounding portion 30a of the frame 30 to the substrate 6, and thus, the light-transmitting layer 4 can be thermally connected to the metal plate 9 and/or an electrode of the substrate 6. Similarly to other embodiments as previously mentioned, as the light-transmitting layer 4 has thermal conductivity higher than thermal conductivity of the phosphor layer 2, it can be expected that the light-transmitting layer 4 in contact with the phosphor layer 2 at a plurality of surfaces can be expected to absorb radiant heat of the phosphor 3 and release the heat to the substrate 6 or the outside of the lighting device 300.

Also, if the light-transmitting layer 4 is a transparent electrode, the light-transmitting layer 4 can be a part of grounding path, similarly to the above-mentioned.

In this embodiment, the substrate 6 includes a metal plate 9 that is thermally connected to the light-emitting element 1. The light-emitting element 1 may be an LED element. Three light-emitting elements 1 are shown aligned on the metal plate 9 of the substrate 6, however, as mentioned above, the number and arrangement of the light-emitting elements 1 are not limited to the embodiments. The substrate 6 includes an electrically insulating layer 61 disposed on the metal plate 9. The electrically insulating layer 61 may include a hole in that an upper surface of the metal plate 9 appears. The light-emitting elements 1 are mounted on the upper surface of the metal plate 9 in the hole of the electrically insulating layer 61.

In this embodiment, a gas 5 is arranged in the second hollow 5 of the frame 30 between the light-transmitting layer 4 and the light-emitting element 1. The frame 30 of this embodiment may be a transparent frame.

Figure 4:
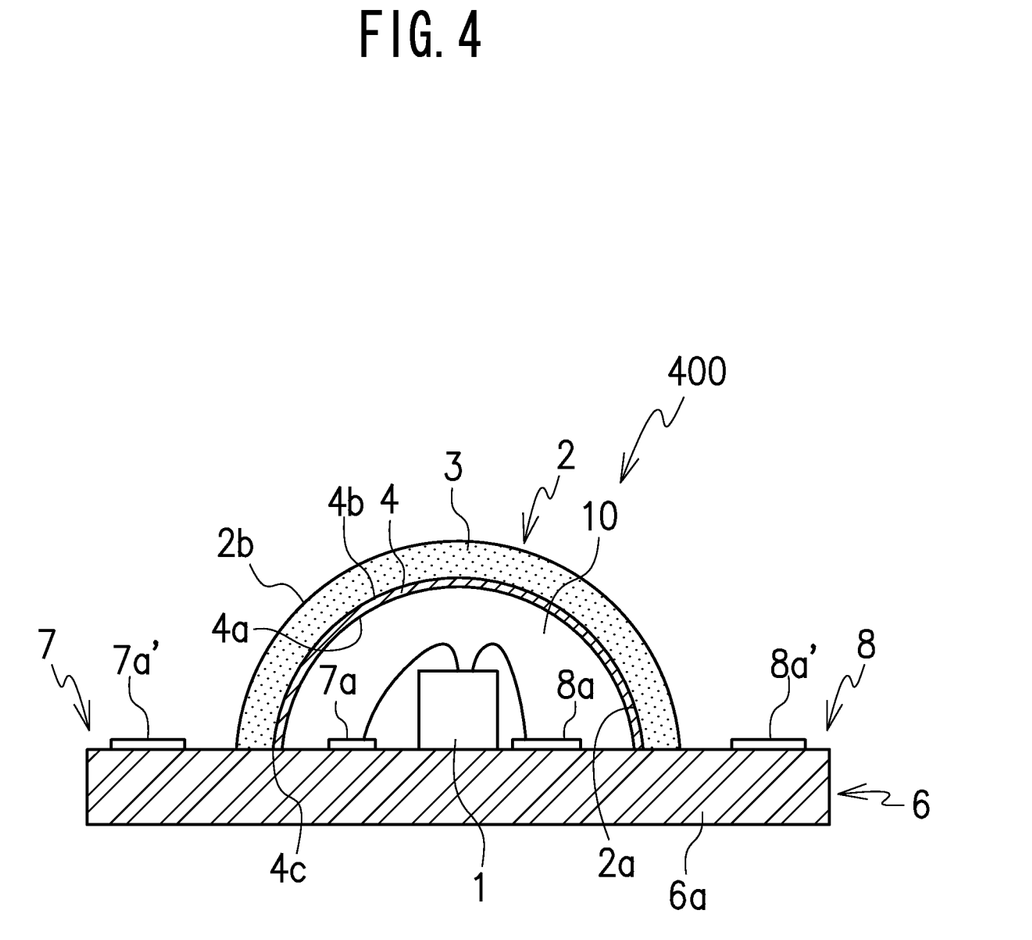
FIG. 4 is a cross-sectional view of a lighting device according to a fourth embodiment of the present invention.

FIG. 4 shows a cross-sectional view of a lighting device 400 according to a fourth embodiment of the present invention.

Different from the first, second, and third embodiments, the lighting device 400 includes a sealing member 10 that seals the light-emitting element 1. In this embodiment the phosphor layer 2 is spaced by the sealing member 10 from the light-emitting diode element 1. The sealing member 10 can be made of a silicone resin and/or a epoxy resin with a thermal conductivity that is around 0.2 W/m·K. Accordingly, the sealing member 10 is less thermally conductive, compared to the light-transmitting layer 4 that may be a transparent electrode. Therefore, radiant heat radiated from the light-emitting element 1 seems to be released through the substrate 6 to the outside of the lighting device 300. Radiant heat radiated from the phosphor 3 included in the phosphor layer 2 can be reflected and/or released through the light-transmitting layer 4 that extends to the substrate 6.

The sealing member 10 has a convex shape similar to a hemisphere. The light-transmitting layer 4 that is layered on the first surface 2a of the phosphor layer 2 is layered on the convex shape of the sealing member 10. In other words, the light-transmitting layer 4 has first and second surface 4a, 4b opposite to each other and a peripheral side edge 4c, and the second surface 4b of the light-transmitting layer 4 is in contact with the first surface 2a of the phosphor layer 2 and the first surface 4a of the light-transmitting layer 4 is in contact with the convex shape of the sealing member 10. The light-transmitting layer 4 is positioned between the phosphor layer 2 and the sealing member 10.

An electrical connection of this embodiment is not shown in details, however, that the light-emitting element 1 is electrically connected to a first electrode 7 (7a and 7a') and a second electrode 8 (8a and 8a') arranged on the substrate 6. A printed electrode pattern that electrically connects the first electrode 7a and 7a', and that electrically connects the second electrode 8a and 8a' may be provided, for example. The substrate 6 may be made of an electrically insulating material, i.e. ceramic, for example.

Similarly to other embodiments, as the light-transmitting layer 4 has thermal conductivity higher than thermal conductivity of the phosphor layer 2, it is expected that the light-transmitting layer 4 absorbs and/or reflects radiant heat radiated from the phosphor 3 included in the phosphor layer 2. In this embodiment, as the light-transmitting layer 4 can be disposed at the peripheral side edge 4c thermally in contact with the substrate 6, heat collected by the light-transmitting layer 4 can be released to the substrate 6.

Figure 5A:
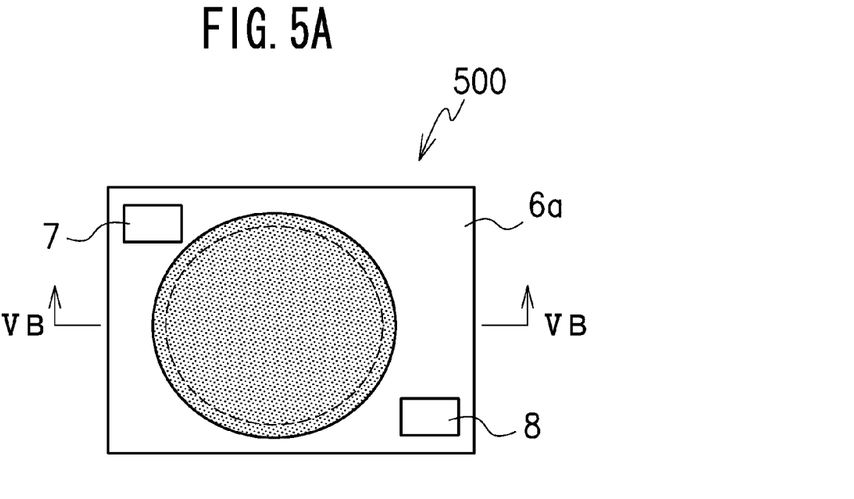
FIG. 5A is a top plan view of a lighting device according to a fifth embodiment and a sixth embodiment of the present invention.
Figure 5B:
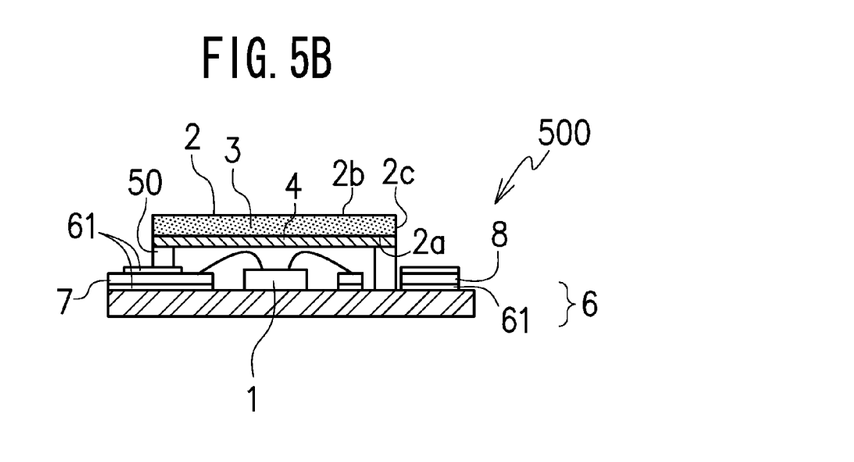
FIG. 5B is a cross-sectional view of a lighting device according to a fifth embodiment of the present invention.

FIG. 5A is a top plan view of a lighting device 500 according to a fifth embodiment, and FIG. 5B is a cross-sectional view of a lighting device 500.

The lighting device 500 includes a light-emitting element 1, and a phosphor layer 2 including a phosphor 3 and spaced from the light-emitting element 1. The light-transmitting layer 4 has thermal conductivity of the phosphor layer 2 higher than thermal conductivity of the phosphor layer 2. The light-transmitting layer 4 is disposed in contact with the phosphor layer 2. The light-transmitting layer 4 may be layered and/or coated on the phosphor layer 2. In this embodiment, a gas may be arranged in a space between the light-emitting element 1 and the light-transmitting layer 4. However, similarly to the fourth embodiment, it is possible that the space between the light-emitting element 1 and the light-transmitting layer 4 is filled by a sealing member.

The phosphor layer 2 has first and second surfaces 2a, 2b opposite to each other and a peripheral side surface 2c between the first surface 2a and the second surface 2b. The light-transmitting layer 4 layered on the first surface 2a of the phosphor layer 2 is a transparent electrode layer.

The lighting device 500 may include a substrate 6. The substrate 6 includes a metal plate 9 and an electrically insulating layer 61 arranged on the metal plate 9, first and second electrodes 7, 8 that are spaced from each other and arranged on the electrically insulating layer 61. The light-emitting element 1 is thermally connected to the metal plate 9 of the substrate 6 and electrically connected to the first electrode 7 and the second electrode 8 of the substrate 6.

Also, the lighting device 500 may include a frame 50. The frame 50 includes an electrically conductive portion that can be a grounding path. The frame 50 is positioned around the light-emitting element 1, and supports the light-transmitting layer 4 that is in contact with the phosphor layer 2. The frame 50 has an upper portion that supports the light-transmitting layer 4. The frame 50 can be electrically insulated from the first electrode 7 and the second electrode 8. The grounding path of the frame 50 can be electrically connected to the metal plate 9 to release a static electrical charge.

For more details, if the frame 50 is made of a metal, the frame 50 itself can be the grounding path to release static electrical charge. In this embodiment, as the grounding path of the frame 50 is partly in contact with on the metal plate 9 of the substrate 6, static electrical charge can be released through the light-transmitting layer 4 and the frame 50 to the metal plate 9.

Also, the frame 50 can be made of an electrically insulating material. In this case, the frame 50 can include an electrically connecting portion that is electrically connected to the light-transmitting layer 4 and to the metal plate 9. The electrically connecting portion can be a grounding path and may be an electrically connecting layer formed on the frame. The grounding path may be a transparent electrode and electrically connected to the light-transmitting layer 4 that is also a transparent electrode.

Figure 5C:
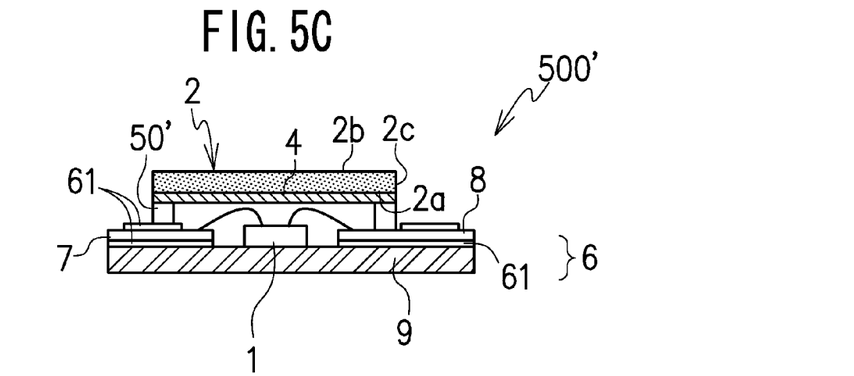
FIG. 5C is a cross-sectional view of a lighting device according to a sixth embodiment of the present invention.

FIG. 5A also can be a top plan view of a lighting device 500' according to a sixth embodiment shown in FIG. 5C of the present invention. As shown in FIG. 5C, the frame 50' of the lighting device 500' includes a grounding path, is positioned around the light-emitting element 1, and supports the light-transmitting layer 4 that is in contact with the phosphor layer 2. Different from the lighting device 500 shown in FIG. 5b, the grounding path included in the frame 50' is electrically insulated from the first electrode 7 of the substrate 60' and the grounding path of the frame 50' is electrically connected to the second electrode 8 of the substrate 60'. The second electrode 8 of the substrate 60' may be a cathode electrode. Generally, a cathode electrode is higher in electrical capacitance than an anode electrode, and in this case, the grounding path is preferably connected to the electrode with a higher electrical capacitance.

Figure 6:
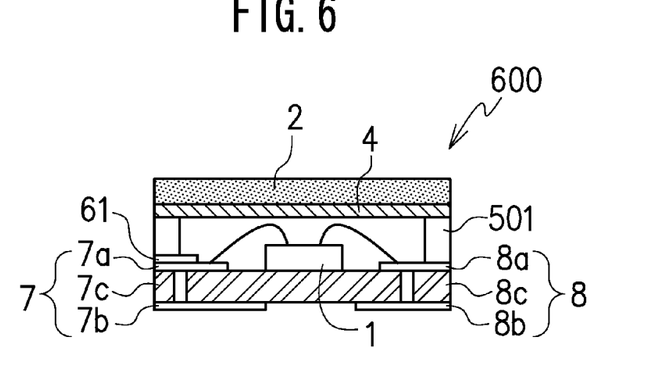
FIG. 6 is a cross-sectional view of a lighting device according to a seventh embodiment of the present invention.

FIG. 6 is a cross-sectional view of a lighting device 600 according to a seventh embodiment of the present invention. In this embodiment, the substrate 6 may be made of an electrically insulating material. Similarly to the lighting device 500' shown in FIG. 5C, the grounding path included in the frame 50' is electrically insulated by an electrically insulating layer 61 from the first electrode 7 of the substrate 60' and the grounding path of the frame 50' is electrically connected to the second electrode 8 of the substrate 60'. The second electrode 8 of the substrate 60' may be a cathode electrode.

Figure 7A:
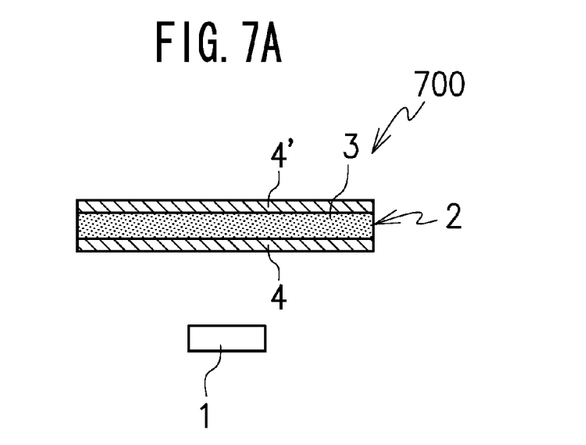
FIG. 7A is a schematic side view of a lighting device according to an eighth embodiment of the present invention.
Figure 7B:
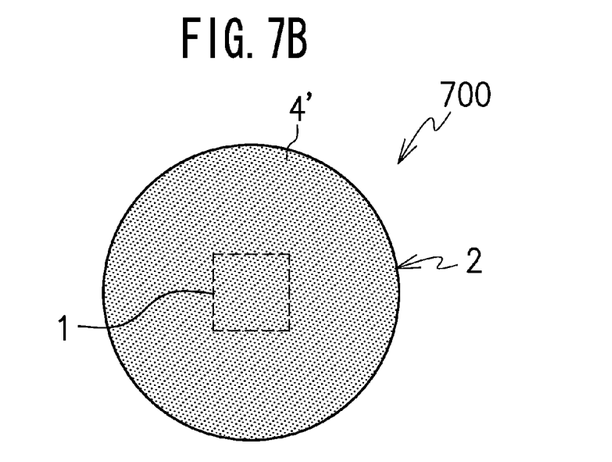
FIG. 7B is a schematic top plan view of the lighting device according to the eighth embodiment of the present invention.

FIG. 7A is a schematic side view of a lighting device 700 according to an eighth embodiment of the present invention, and FIG. 7B is a schematic top plan view of the lighting device 700.

The lighting device 700 includes a light-emitting element 1, a phosphor layer 2 that includes a phosphor 3 and spaced from the light-emitting element 1, and a light-transmitting layer 4 with thermal conductivity that is higher than thermal conductivity of the phosphor layer 2. The light-transmitting layer 4 is arranged in contact with the phosphor layer 2. The light-transmitting layer 4 may be layered and/or coated on the phosphor layer 2.

For more details, the phosphor layer 2 has first and second surfaces 2a, 2b opposite to each other. The first surface 2a of the phosphor layer 2 faces the light-emitting element 1. The light-transmitting layer 4 in this embodiment includes a first light-transmitting layer 4 that transmits light emitted from the light-emitting element 1 and disposed on the first surface 2a of the phosphor layer 2. The light-transmitting layer 4 in this embodiment further includes a second light-transmitting layer 4' that transmits visible light and is disposed on the second surface 2b of the phosphor layer 2.

Similarly to other embodiments, as the light-transmitting layer 4 has thermal conductivity higher than thermal conductivity of the phosphor layer 2, it can be expected that the light-transmitting layer 4 prevents radiant heat radiated from the light-emitting element 1 from entering the phosphor layer 2.

Also, as the phosphor 3 included in the phosphor layer 2 generates heat when excited by the light from the light-emitting element 1, the first light-transmitting layer 4 disposed on the first surface 2a of the phosphor layer 2 can be expected to absorb and/or reflect radiant heat from the phosphor 3. The light-transmitting layer 4 may be configured to release heat outside of the lighting device 700 through a heat-conductive material included in the lighting device 700, as previously mentioned. The heat-conductive material may be an electrode of a substrate, a substrate made of ceramic, a metal plate included in a substrate, a metal portion of a frame, and/or a frame itself made of a metal.

Furthermore, with the configuration of the eighth embodiment of the lighting device 700, as the first light-transmitting layer 4 is positioned at a side where a light-emitting element 1 is arranged and the second light-transmitting layer 4' is positioned at a side where light emitted from the phosphor and light emitted from the light-emitting element 1 are transmitted through, it is expected that luminance efficiency of the lighting device 700 is enhanced.

For example, the light-emitting element 1 may include a blue light-emitting element and the phosphor 3 included in the phosphor layer 2 may be YAG phosphor. In this case, the first light-transmitting layer 4 can be an antireflection layer that minimizes the loss of light emitted from the light-emitting element 1. The antireflection layer is an optical coating to reduce reflection. The first light-transmitting layer 4 reduces the loss of blue light and transmits blue light emitted from the blue light-emitting element to the phosphor layer 2. Also, the second light-transmitting layer 4' can be an antireflection layer that reduces the loss of visible light. The second light-transmitting layer 4' reduces reflection of visible light and transmits the visible light to the outside of the lighting device 700. In this case, the visible light is a mixed light of blue light emitted from the blue light-emitting element and yellow light emitted from the YAG phosphor. The light-emitting element 1 may include an ultraviolet light-emitting element, however, the light-emitting element and the phosphor are not limited thereto of the embodiments. The light-emitting element may be a light-emitting package comprising a red light-emitting diode element.

Accordingly, it is expected that the luminance efficiency of the lighting device 700 is enhanced with this configuration.

Figure 8:
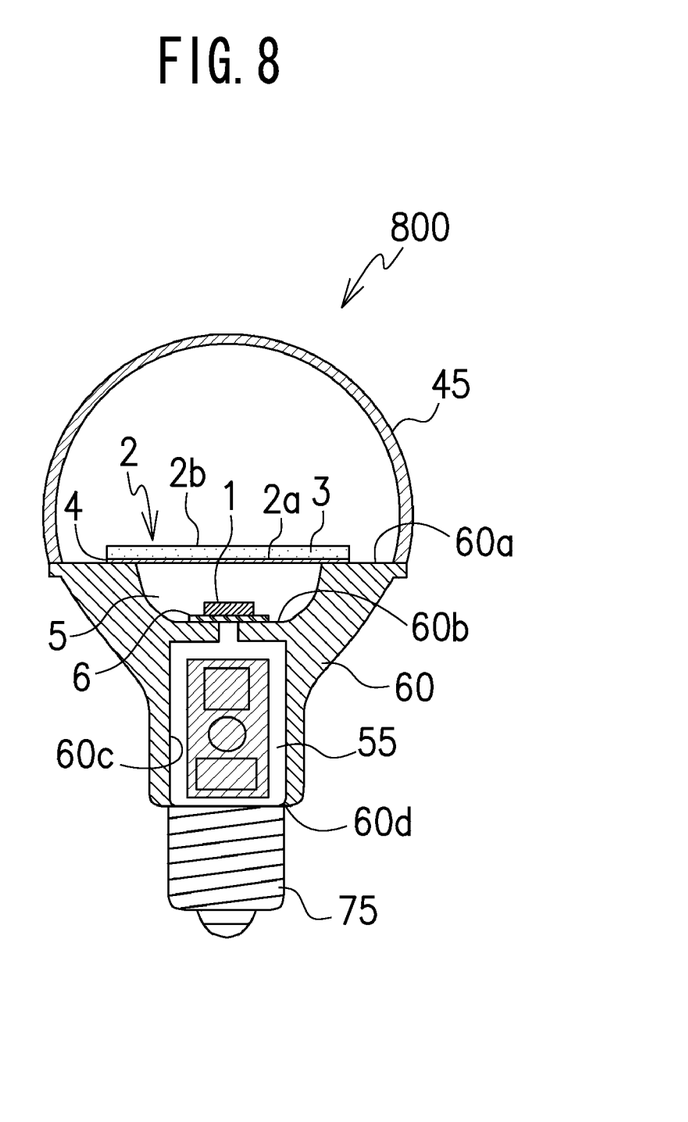
FIG. 8 is a cross-sectional view of a lighting device according to a ninth embodiment of the present invention.

FIG. 8 shows a cross-sectional view of a lighting device 800 according to a ninth embodiment of the present invention. In this embodiment, the lighting device 800 can be a light bulb.

The lighting device 800 includes a light-emitting element 1, a phosphor layer 2 including a phosphor 3 and spaced from the light-emitting element 1, and a light-transmitting layer 4 with thermal conductivity that is higher than thermal conductivity of the phosphor layer 2. The light-transmitting layer 4 is disposed in contact with the phosphor layer 2. The light-transmitting layer 4 may be layered and/or coated on the phosphor layer 2. In this embodiment, the light-transmitting layer 4 is layered on the first surface 2a of the phosphor layer 2. The light-transmitting layer 4 may be a transparent electrode layer.

The lighting device 800 further includes a frame 60 positioned around the light-emitting element 1. The frame 60 positions the light-transmitting layer 4 layered on the first surface 2a of the phosphor layer 2 spaced from the light-emitting element 1. The light-transmitting layer 4 layered on the phosphor layer 2 and supported by the frame can be thermally connected to the frame 60, which includes a heat conductive portion. The light-emitting element 1 in this embodiment may be a light-emitting package in that a plurality of LED elements are arranged.

The lighting device 800 further includes a screw base 75 that is positioned below the light-emitting element 1 and configured to supply electricity from outside of the lighting device 700 to the light-emitting element 1. The screw base 75 may be positioned adjacent to a lower portion 60d of the frame 60. The lighting device 800 may include a light-transmitting cover 45 covering above the phosphor layer 2. The light-transmitting cover 45 may be made of a glass. The light-transmitting cover 45 may be made of a light-transmitting resin.

The frame 60 includes a first hollow 60b in that the light-emitting element 1 is supported. The frame 60 positions the phosphor layer 2 with the light-transmitting layer 4 spaced from the light-emitting element 1. The phosphor layer 2 in contact with the light-transmitting layer 4 is supported on an upper surface 60a of the frame above the light-emitting element 1. In this embodiment, the frame 60 may include a second hollow 60c that can house a drive circuit 55 that is electrically connected to the light-emitting element 1 and configured to supply electricity that is supplied through the screw base 75 to the light-emitting element 1.

Figure 9:
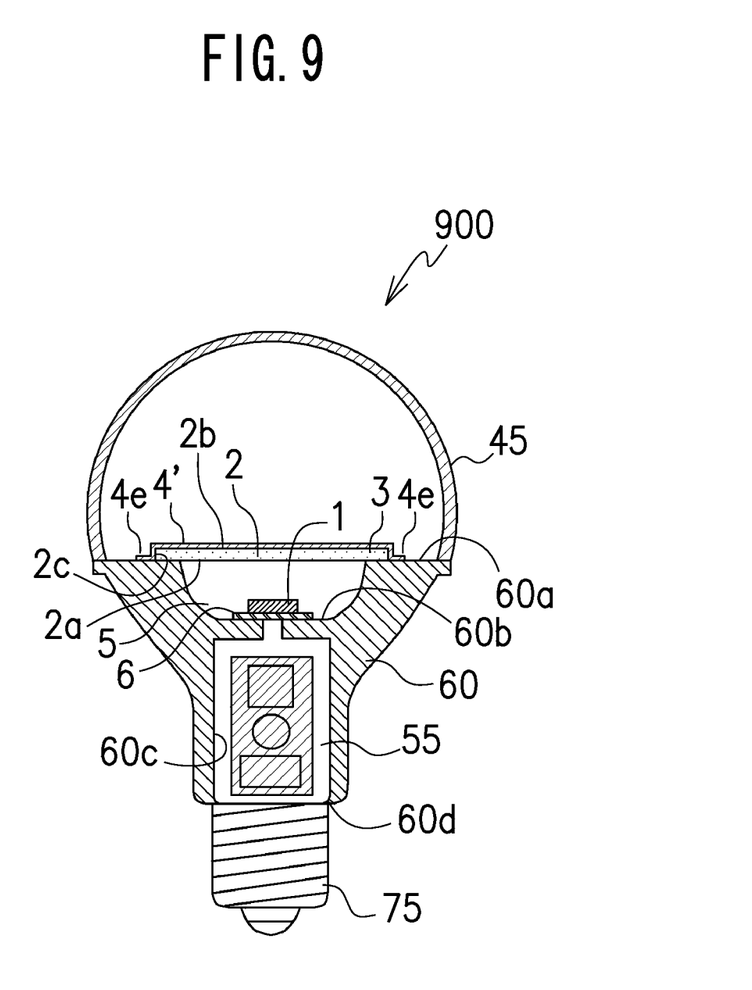
FIG. 9 is a cross-sectional view of a lighting device according to a tenth embodiment of the present invention.

FIG. 9 shows a cross-sectional view of a lighting device 900 according to the tenth embodiment. In this embodiment, a light-transmitting layer 4' is disposed in contact with a second surface 2b of a phosphor plate 2'. The second surface 2b of the phosphor plate 2' faces the light-transmitting cover 45, which is configured to be a light-emitting portion of a light bulb. The light-transmitting layer 4' can be extended from the second surface 2b of the phosphor plate 2' through a peripheral side surface 2c of the phosphor plate 2' to the upper surface 60a of the frame 60. Accordingly, the light-transmitting layer 4' in this embodiment includes an annular portion 4e that is in contact with the upper surface 60a of the frame 60. The light-transmitting layer 4' can be configured to transmit visible light, similarly to the second light-transmitting layer 4' shown in the lighting device 700 in FIG. 7A and FIG. 7B.

Figure 10:
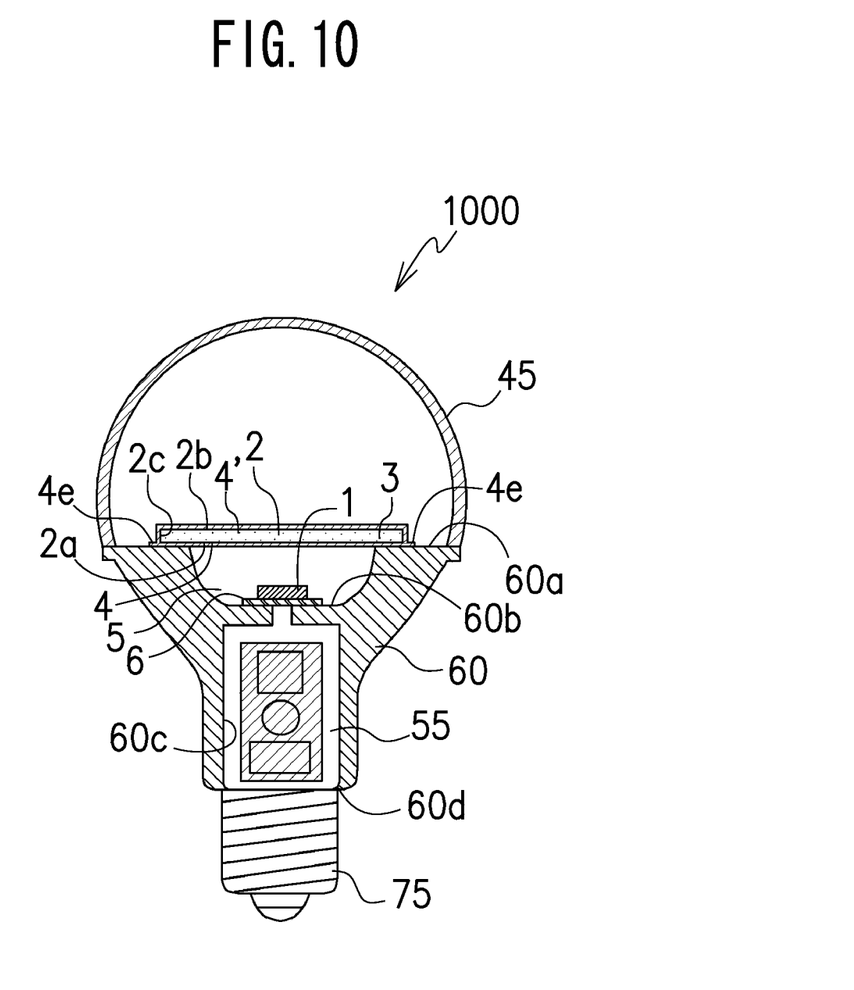
FIG. 10 is a cross-sectional view of a lighting device according to an eleventh embodiment of the present invention.

FIG. 10 shows a cross-sectional view of a lighting device 1000 according to an eleventh embodiment of the present invention. In this embodiment, a first light-transmitting layer 4 is disposed in contact with a first surface 2a of a phosphor plate 2'. The first light-transmitting layer 4 may entirely cover the first surface 2a of the phosphor plate 2'. A second light-transmitting layer 4' is disposed in contact with a second surface 2b of the phosphor plate 2'. The second light-transmitting layer 4' may entirely cover the second surface 2b and a peripheral side surface 2c of the phosphor plate 2'. The light-transmitting layer 4' can be extended from the second surface 2b of the phosphor plate 2' through the peripheral side surface 2c of the phosphor plate 2' to the upper surface 60a of the frame 60. Accordingly, the light-transmitting layer 4' in this embodiment includes an annular portion 4e that is in contact with the upper surface 60a of the frame 60. The light-transmitting layer 4' can be thermally and electrically connected to the frame to release heat and/or static electrical charge, similarly to other embodiments.

Furthermore, while certain embodiments of the present inventive subject matter have been illustrated with reference to specific combinations of elements, various other combinations may also be provided without departing from the teachings of the present inventive subject matter. Thus, the present inventive subject matter should not be construed as being limited to the particular exemplary embodiments described herein and illustrated in the Figures, but may also encompass combinations of elements of the various illustrated embodiments.

Many alterations and modifications may be made by those having ordinary skill in the art, given the benefit of the present disclosure, without departing from the spirit and scope of the inventive subject matter. Therefore, it must be understood that the illustrated embodiments have been set forth only for the purposes of example, and that it should not be taken as limiting the inventive subject matter as defined by the following claims. The following claims are, therefore, to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the inventive subject matter.

What is claimed is:

1. A lighting device comprising:
   a substrate comprising an electrically insulating layer and first and second electrodes, the first and second electrodes being spaced from each other and disposed on the electrically insulating layer;
   a light-emitting element mounted on the electrically insulating layer of the substrate and electrically connected to the first electrode and the second electrode of the substrate;
   a phosphor layer comprising a phosphor and spaced from the light-emitting element; and
   a light-transmitting layer with thermal conductivity that is higher than thermal conductivity of the phosphor layer, the light-transmitting layer disposed in contact with the phosphor layer, the light-transmitting layer comprises a transparent electrode layer and is configured to release static charge to the second electrode that is a cathode electrode of the substrate.

2. The lighting device according to claim 1, wherein a gas is arranged between the light-emitting element and the light-transmitting layer.

3. The lighting device according to claim 1, wherein the phosphor layer has first and second surfaces opposite to each other, and the first surface faces the light-emitting element, and the light-transmitting layer that transmits light emitted from the light-emitting element is disposed on the first surface of the phosphor layer.

4. The lighting device according to claim 3, wherein the light-transmitting layer is entirely disposed on the first surface of the phosphor layer.

5. The lighting device according to claim 3, wherein the light-transmitting layer is layered on the first surface of the phosphor layer and a peripheral side surface that extends between the first surface and the second surface of the phosphor layer.

6. The lighting device according to claim 1, further comprising:
a frame comprising a grounding path, positioned around the light-emitting element, and supporting the light-transmitting layer that is in contact with the phosphor layer,
wherein the substrate comprises a metal plate that is thermally connected to the light-emitting element,
the electrically insulating layer is disposed on the metal plate,
the frame is electrically insulated from the first electrode of the substrate, and
the grounding path of the frame is electrically connected to the second electrode of the substrate.

7. The lighting device according to claim 1, wherein the transparent electrode layer comprises an indium tin oxide layer.

8. The lighting device according to claim 1, wherein the light-transmitting layer comprises a tin oxide layer.

9. The lighting device according to claim 1, wherein the light-transmitting layer comprises a zinc oxide layer.

10. The lighting device according to claim 1 comprising:
the phosphor layer having first and second surfaces opposite to each other, and the first surface facing the light-emitting element; and
the light-transmitting layer comprising a first light-transmitting layer that transmits light emitted from the light-emitting element and is disposed on the first surface of the phosphor layer and comprising a second light-transmitting layer that transmits visible light and is disposed on the second surface of the phosphor layer.

11. The lighting device according to claim 1 comprising:
a frame that positions the phosphor layer with the light-transmitting layer spaced from the light-emitting element.

12. The lighting device according to claim 1 further comprising:
a sealing member that seals the light-emitting element and the phosphor layer spaced by the sealing member from the light-emitting element.

13. The lighting device according to claim 1, wherein the light-emitting element comprises a blue light-emitting diode element.

14. The lighting device according to claim 1, wherein the light-emitting element comprises ultraviolet light-emitting diode element.

15. The lighting device according to claim 1, wherein the phosphor comprised in the phosphor layer comprises yttrium aluminum garnet phosphor.

16. The lighting device according to claim 1, wherein the light-emitting element is a light-emitting package comprising a red light-emitting diode element.

17. The lighting device according to claim 1 further comprising:
a screw base configured to supply electricity to the light-emitting element.

18. The lighting device according to claim 1 further comprising:
a frame supporting the light-transmitting layer layered on the phosphor layer, and the light-transmitting layer comprising an annular portion that is in contact with the frame.

19. A lighting device comprising:
a substrate comprising a metal plate, an electrically insulating layer arranged on the metal plate, first and second electrodes that are spaced from each other and disposed on the electrically insulating layer,
a light-emitting element electrically connected to the first electrode and the second electrode of the substrate;
a phosphor layer comprising a phosphor and spaced from the light-emitting element;
a light-transmitting layer comprising a transparent electrode layer and disposed in contact with the phosphor layer; and
a frame comprising a grounding path, positioned around the light-emitting element, supporting the light-transmitting layer that is in contact with the phosphor layer, and the frame being electrically insulated from the first electrode and the second electrode, and the grounding path of the frame being electrically connected to the metal plate of the substrate to release static charge to the metal plate of the substrate.

20. The lighting device according to claim 19, wherein the light-emitting element comprises a blue light-emitting diode element.

21. The lighting device according to claim 19 further comprising:
a screw base positioned below the light-emitting element and configured to supply electricity to the light-emitting element.

22. The lighting device according to claim 19, wherein the light-transmitting layer comprises a dielectric layer.

* * * * *